US006777169B2

(12) United States Patent
Hwang et al.

(10) Patent No.: US 6,777,169 B2
(45) Date of Patent: Aug. 17, 2004

(54) METHOD OF FORMING EMITTER TIPS FOR USE IN A FIELD EMISSION DISPLAY

(75) Inventors: Ying-Diean Hwang, Miaoli (TW); Chih-Chin Chang, Hsinchu (TW)

(73) Assignee: Au Optronics Corp., Hsinchu (TW)

( * ) Notice: Subject to any disclaimer, the term of this patent is extended or adjusted under 35 U.S.C. 154(b) by 99 days.

(21) Appl. No.: 10/193,013

(22) Filed: Jul. 9, 2002

(65) Prior Publication Data

US 2003/0017423 A1 Jan. 23, 2003

(30) Foreign Application Priority Data

Jul. 11, 2001 (TW) ....................................... 90116988 A

(51) Int. Cl.[7] ............................. H01L 21/00; H01J 1/16

(52) U.S. Cl. ........................ 430/311; 430/322; 430/323; 430/324; 438/20; 313/310; 313/336; 313/351

(58) Field of Search ................................ 430/311, 322, 430/323, 324; 438/20; 313/310, 336, 351

(56) References Cited

U.S. PATENT DOCUMENTS 5,543,686 A * 8/1996 Huang et al. ............... 313/497
5,886,460 A * 3/1999 Jones et al. ................. 313/310

* cited by examiner

*Primary Examiner*—Mark F. Huff
*Assistant Examiner*—Daborah Chacko-Davis
(74) *Attorney, Agent, or Firm*—Ladas & Parry

(57) ABSTRACT

A method of forming emitter tips for use in a field emission display. A dielectric layer, an insulating layer, and a conductor layer are formed on a substrate in sequence. An annular groove is formed the conductive layer and the insulating layer. A tip cavity with an insulating tip within is formed by isotropic wet etching. A molybdenum metal layer is formed on the insulating tip. The method of the present invention can substantially reduce the consumption of molybdenum.

15 Claims, 12 Drawing Sheets

METHOD OF FORMING EMITTER TIPS FOR USE IN A FIELD EMISSION DISPLAY

BACKGROUND OF THE INVENTION

1. Field of the Invention

The present invention relates to a method of forming emitter tips for use in a field emission display. In particular, the present invention relates to the fabrication of emitter tips including insulating tips with a molybdenum metal layer thereon.

2. Description of the Related Art

FIG. 1 shows a cross-section diagram of a field emission display in the prior art. A conductive cathode 13, an insulating layer 16, and a dielectric layer 11 are formed on a substrate 10. A plurality of emitter tips 2 are formed on the insulating layer 16, connecting to a tip cavity 3 and an opening 4 nearby. A gate electrode 5 and a contact layer 7 are formed on the dielectric layer 11. A conductive layer 18 and an interval 8 are formed on the contact layer 7. An anode plate 9 is formed on the interval 8 in which is opposed to the gate electrode 5 and the emitter tips.

Fowler and Nordheim proposed the earliest emission theory. The following current emission equation is derived from the Quantum Mechanics:

$$I = \frac{\alpha A \beta^2 V^2}{\Phi t^2} \exp\left[-Bv(y)\frac{\Phi^{\frac{3}{2}}}{\beta V}\right]$$

β: ratio in electric field
Φ: work unction in electrode material
t: time
V: applied voltage Referring to FIG. 1, emitter tips emit electrons by increasing the applied voltage into the region between the gate electrode 5 and emitter tips 2 until the equation above is met. After electrons from emitter tips 2 pass by the opening 4, the electrons are attracted by the anode plate 9 and start accelerating. Thereby electron bombardment activity on the surface of anode plate 9 containing luminescence powder (not shown) takes place. The luminescence powder being bombarded by electrons begins to radiate. The light beam, formed by radiation, passes through the anode plate 9 and emerges onto the opposite side of the anode plate 9, the emission display panel.

A cathode panel of field emission display in the prior art, having six thin films, requires six lithography and etching process runs.

FIG. 2A to FIG. 2E illustrate the fabrication in field emission display of the prior art. The fabrication steps are deposition, etching, sputtering, and lift-off. FIG. 2A illustrates a cathode conductive layer 13, a dielectric layer 11, an insulating layer 16, and a gate electrode layer 5 formed onto a substrate 10 in sequence. An opening 4 of about one micron in width is formed within the gate electrode layer 5. FIG. 2B, a cavity is formed inside the dielectric layer with conventional etching. The cavity is about two microns wide.

As shown in FIG. 2C, the sputtering for an aluminum metal layer 19 is performed by inclining the panel to an angle, for example, at 20 degree.

As shown in FIG. 2D, after the aluminum metal layer 19 is formed on the gate electrode layer 5, a molybdenum metal layer 20 is sputtered onto the aluminum metal layer 19 and the dielectric layer 11 respectively. When the molybdenum metal layer 20 and the aluminum metal layer 19 on the gate electrode layer 5 are removed with phosphoric acid, a cone-like emitter tip made of molybdenum metal is formed, as shown in FIG. 2E.

However, molybdenum is very expensive. To save cost, therefore, it is desirable to reduce the amount of molybdenum consumed during the emitter tips fabrication.

SUMMARY OF THE INVENTION

The present invention provides a method of forming emitter tips for use in a field emission display. A first dielectric layer, an insulating layer, and a conductive layer are formed on a substrate in sequence. An opening and a tip cavity are formed in the conductive layer. An insulating tip is formed on the first dielectric layer. Finally, a molybdenum metal layer on the insulating tip is formed. The method of the present invention can substantially reduce the consumption of molybdenum.

BRIEF DESCRIPTION OF THE DRAWINGS

In order to fully understand the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are not to be considered limiting of its scope, the invention will be described and explained with additional specificity and detail through the use of the accompanying drawings in which.

DETAILED DESCRIPTION OF THE INVENTION

Figure 1:
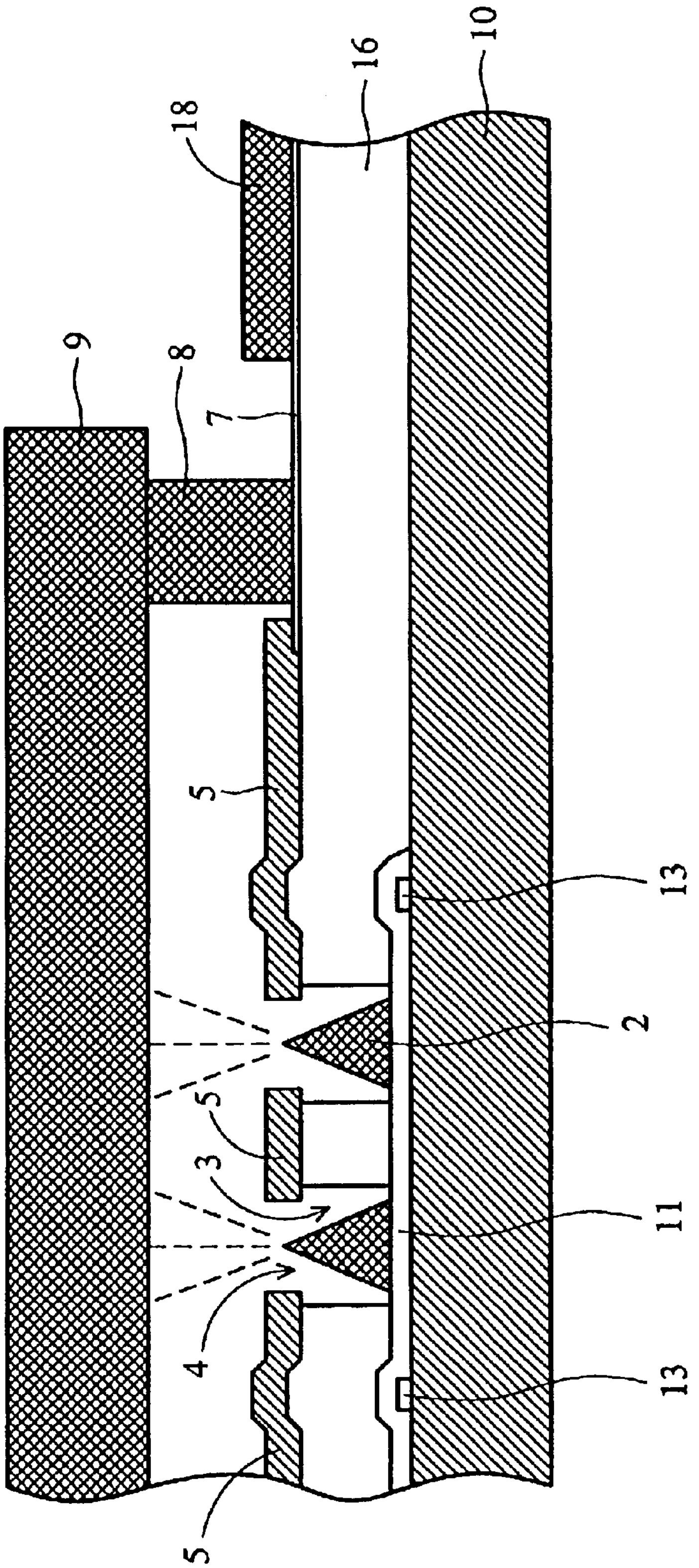
FIG. 1 ( PRIOR ART )
FIG. 1 is a cross-section of the field emission display.
Figure 2A:
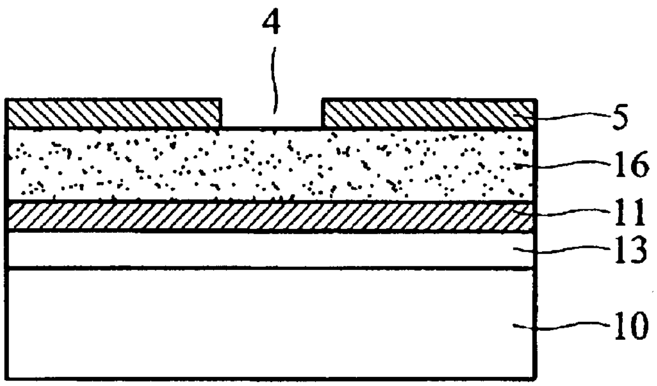
FIG. 2A ( PRIOR ART )
FIGS. 2A to 2E are diagrams illustrating the process of emitter tip formation of the prior art.
Figure 2B:
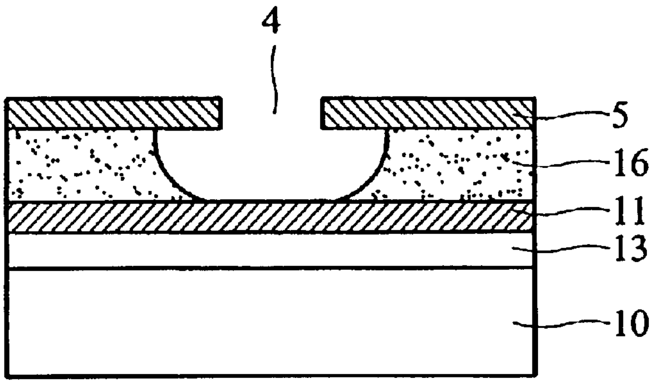
FIG. 2B ( PRIOR ART )
Figure 2C:
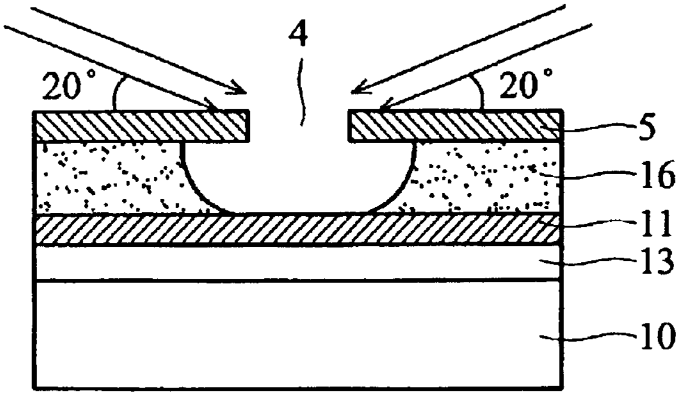
FIG. 2C ( PRIOR ART )
Figure 2D:
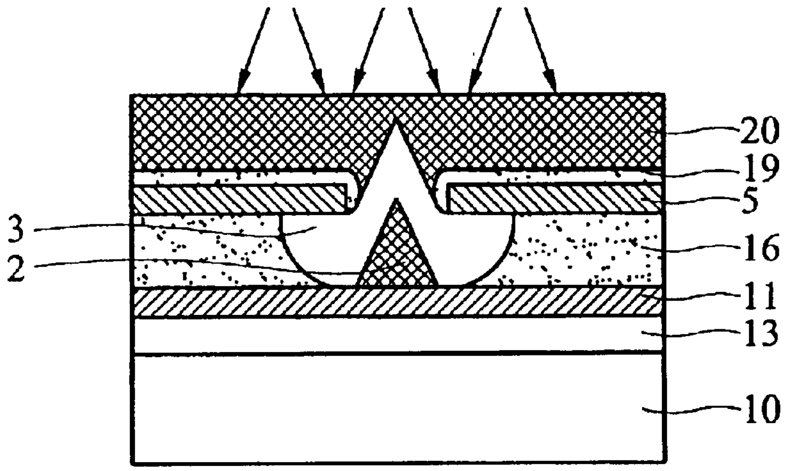
FIG. 2D ( PRIOR ART )
Figure 2E:
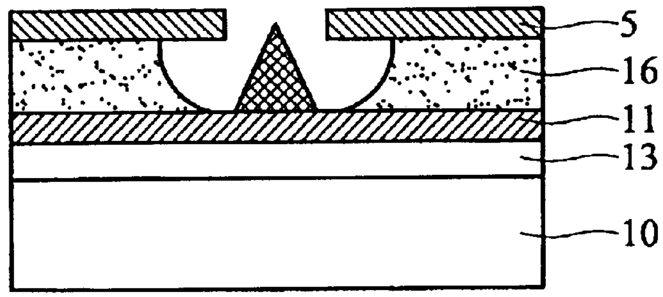
FIG. 2E ( PRIOR ART )
Figure 3:
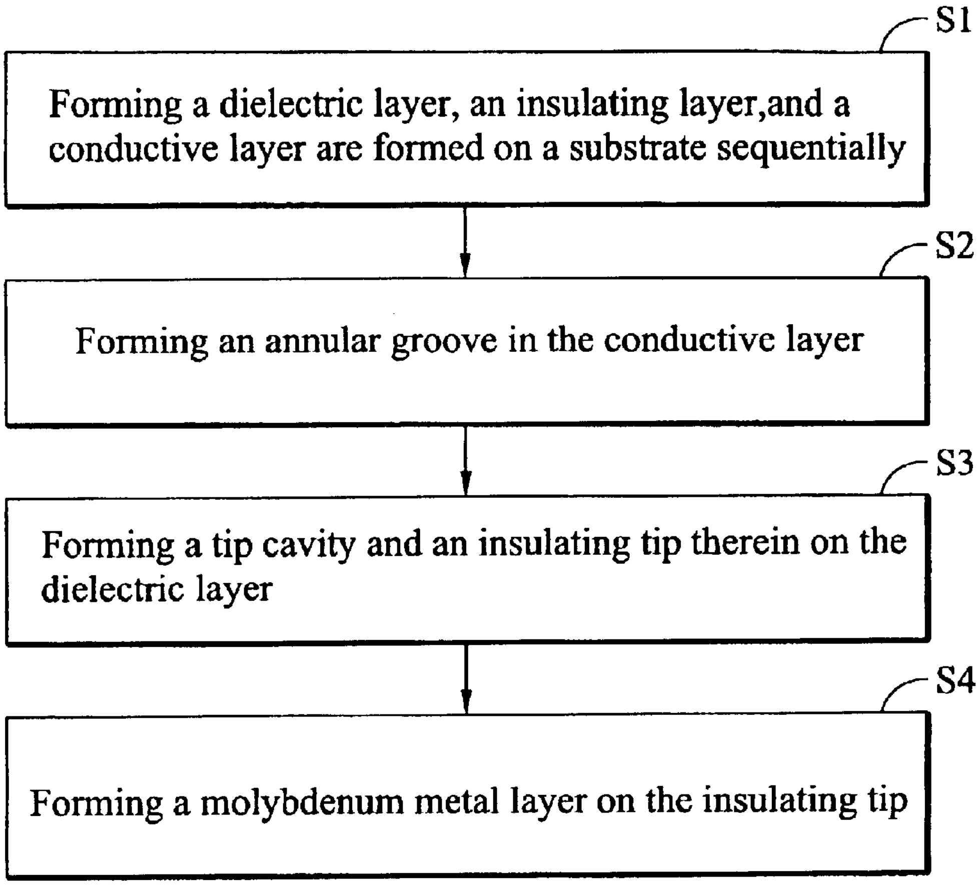
FIG. 3 is a flow chart of the present invention.

FIG. 3 is a process flow chart generally describing the method of the present invention. In Step 1, a dielectric layer, an insulating layer, and a conductive layer are formed on a substrate sequentially. In Step 2, an annular groove is formed in the conductive layer. In Step 3, a tip cavity and an insulating tip therein are formed on the dielectric layer. In step 4, a molybdenum metal layer is formed on the insulating tip. Thereby, an emitter tip with reduced consumption of molybdenum is achieved. In addition, the fabrication time is shortened.

Embodiment 1

Figure 4A:
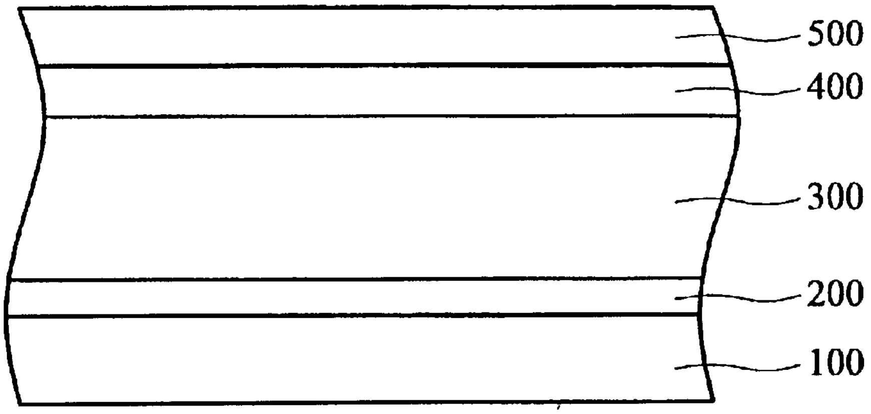
FIG. 4A to FIG. 4G are diagrams illustrating the process of emitter tip formation according to the first embodiment of the present invention.

FIG. 4A to FIG. 4G are diagrams illustrating the process of forming emitter tips according to the first embodiment of the present invention. As shown in FIG. 4A, a dielectric layer 200, an insulating layer 300, a conductive layer 400, and a photoresist layer 500 are formed on a-substrate 100 in sequence. The substrate 100 is made of glass or silicon wafer.

Figure 4B:
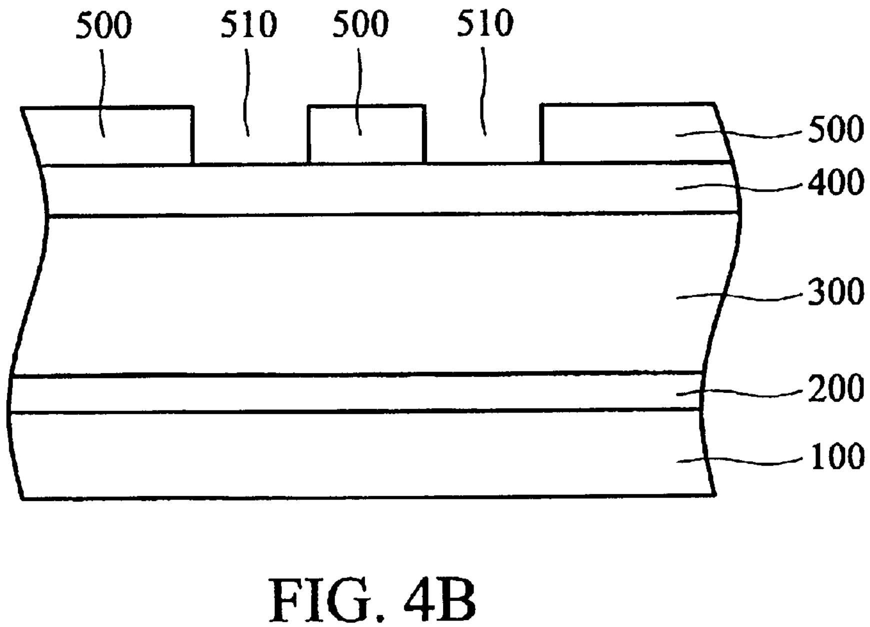
Figure 4C:
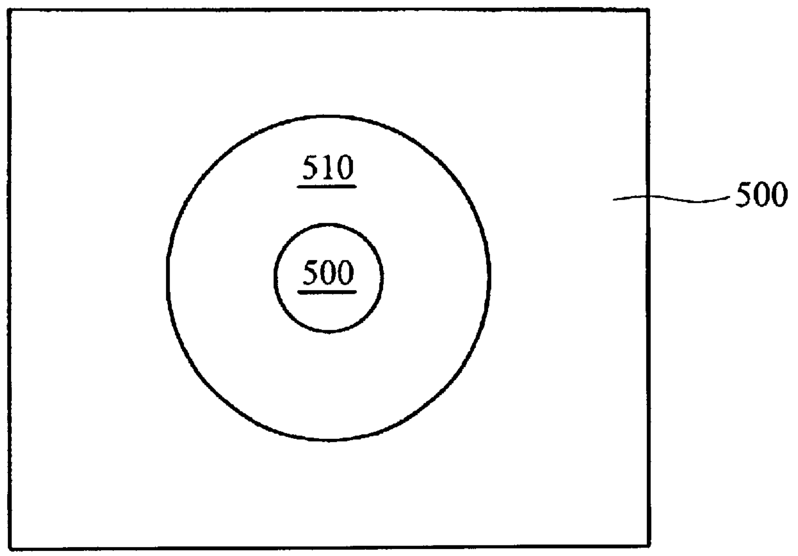
Figure 4D:
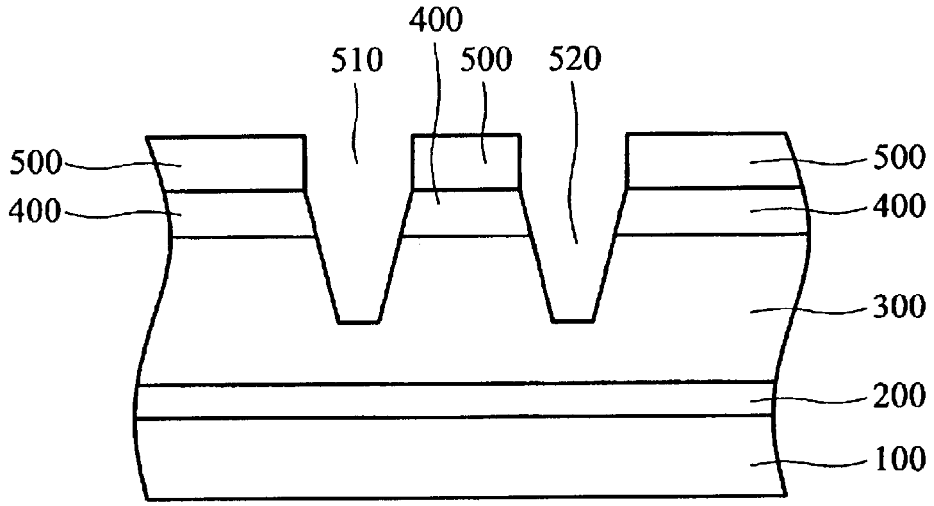

An annular opening 510 is formed in a predetermined position of the photoresist layer 500, shown in FIG. 4B. The insulating layer 300 and the conductive layer 400 are etched to form an annular groove 520, shown in FIGS. 4C and 4D.

Figure 4E:
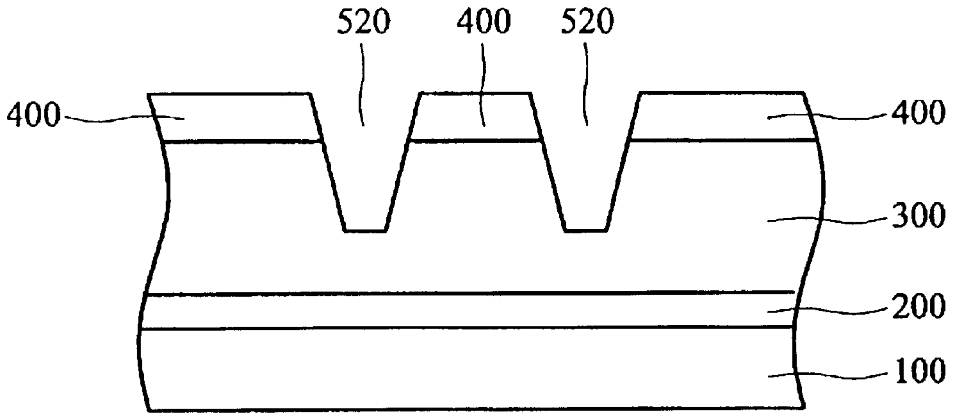

The etching applied here for the annular groove 520 is dry etching. When the annular groove 520 is formed, the photoresist layer 500 is then removed, as shown in FIG. 4E.

Figure 4F:
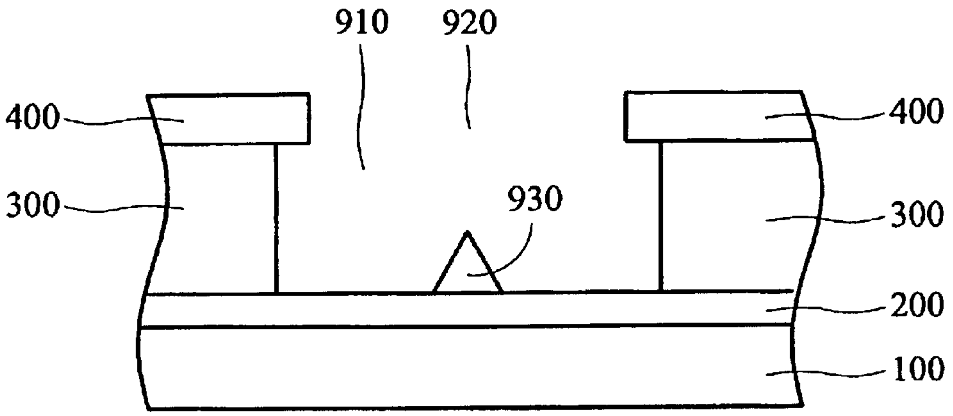

As shown in FIG. 4F, the conductive layer 400 and the insulating layer 300 are etched to enlarge the annular groove 520. Then, an insulating tip 930 is formed on the first dielectric layer 200. The etching applied here is isotropic wet etching.

Figure 4G:
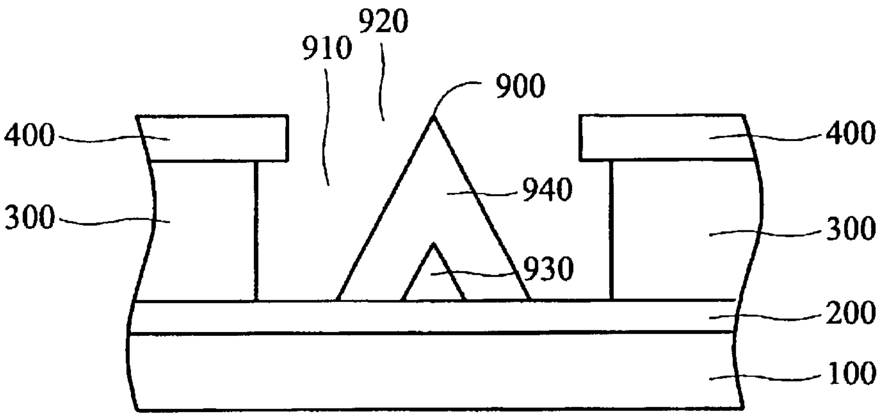

Finally, as shown in FIG. 4G, a molybdenum metal layer 940 is formed on the insulating tip 930 by using conventional sputtering or an electron beam. Thereby, an emitter tip 900 for use in the field emission display of the present invention is completed.

Embodiment 2

Figure 5A:
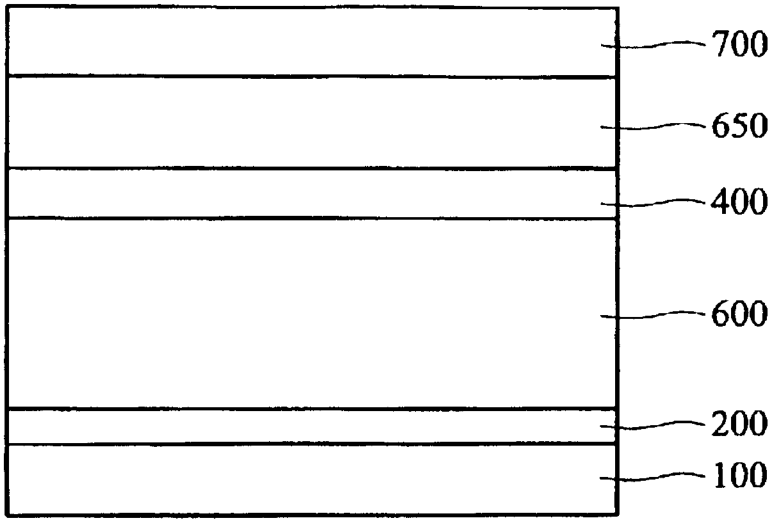
FIG. 5A to FIG. 5G are diagrams illustrating the process of emitter tip formation according to the second embodiment of the present invention.

FIG. 5A to FIG. 5G are diagrams illustrating the process of emitter tips formation according to the second embodiment of the present invention. As shown in FIG. 5A, a dielectric layer 200, a first insulating layer 600, a conductive layer 400, a second insulating layer 650, and a photoresist layer 700 are formed on a substrate 100 in sequence. The substrate 100 is made of glass or silicon substrate.

Figure 5B:
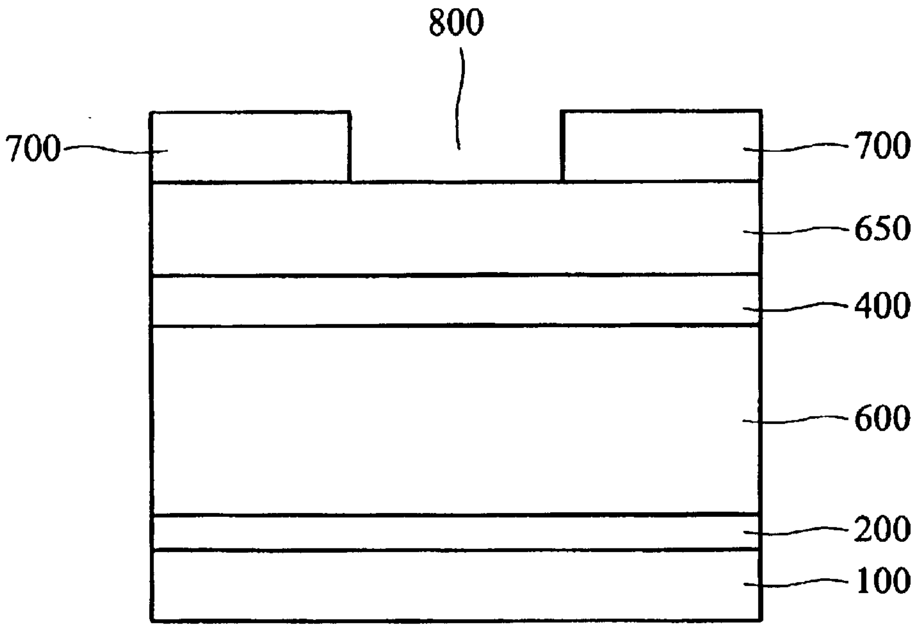

As shown in FIG. 5B, an opening 800 is formed in a predetermined position in the photoresist layer 700.

Figure 5C:
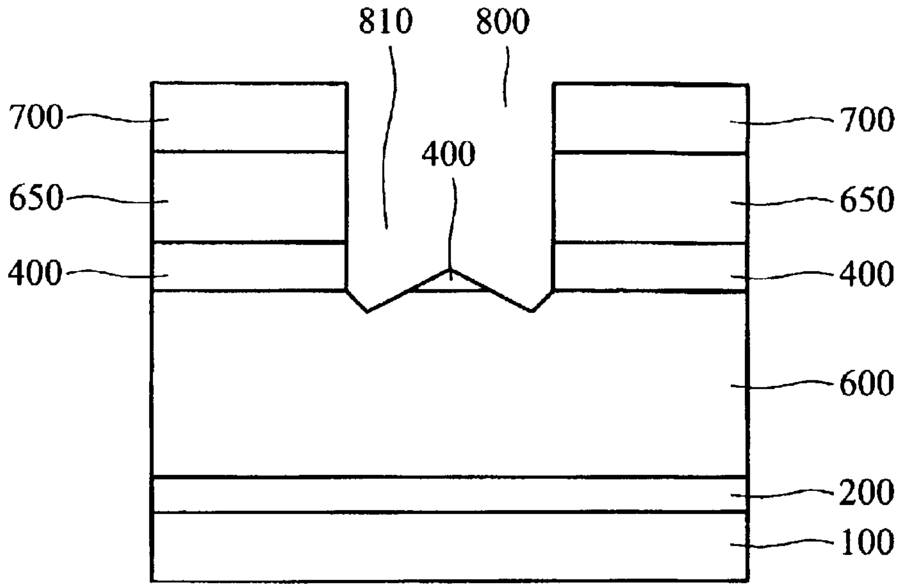

As shown in FIG. 5C, using the photoresist layer 700 as a protective layer, the second insulating layer 650 and the first conductive layer 400 are dry etched to form a hole 810 and leave a remaining portion of conductive layer 400 on the first insulating layer 600.

Figure 5D:
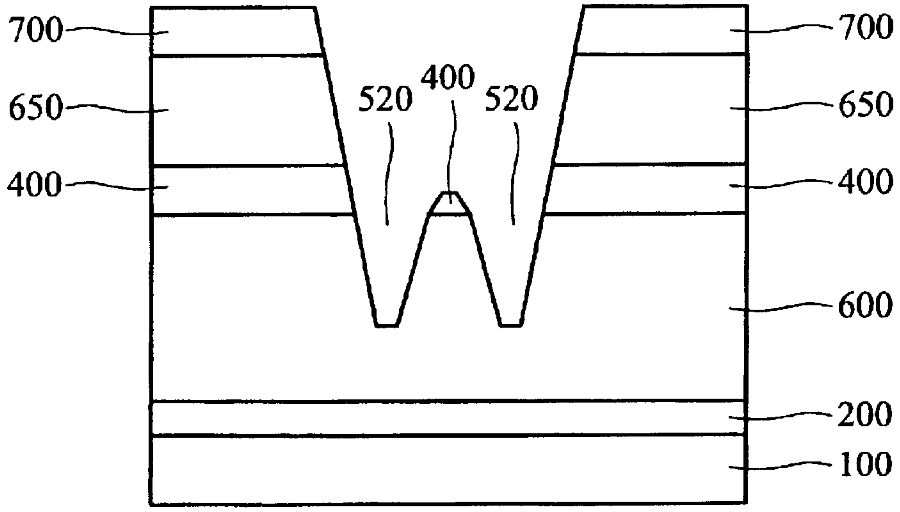

As shown in FIG. 5D, the first insulating layer 600 and the remaining portion of the conductive layer 400 are dry etched with high etching selectivity to form an annular groove 520 in the first insulating layer 600.

Figure 5E:
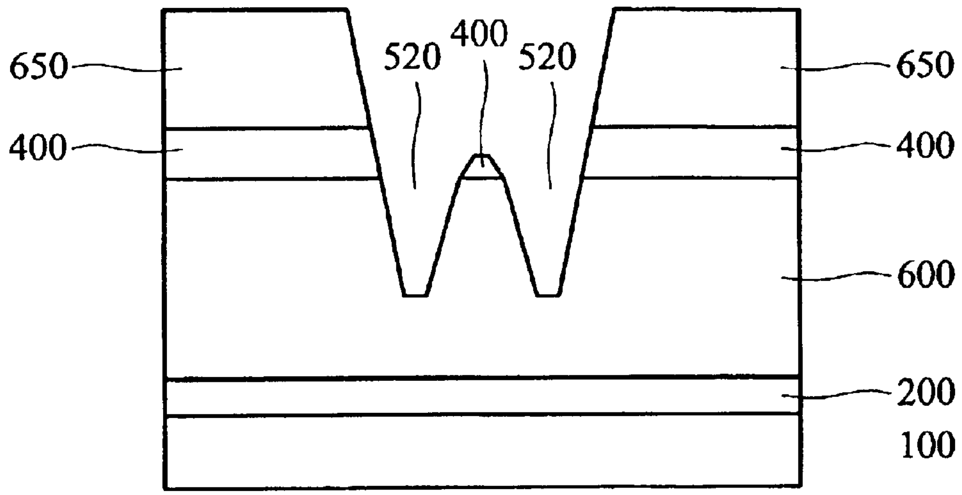
Figure 5F:
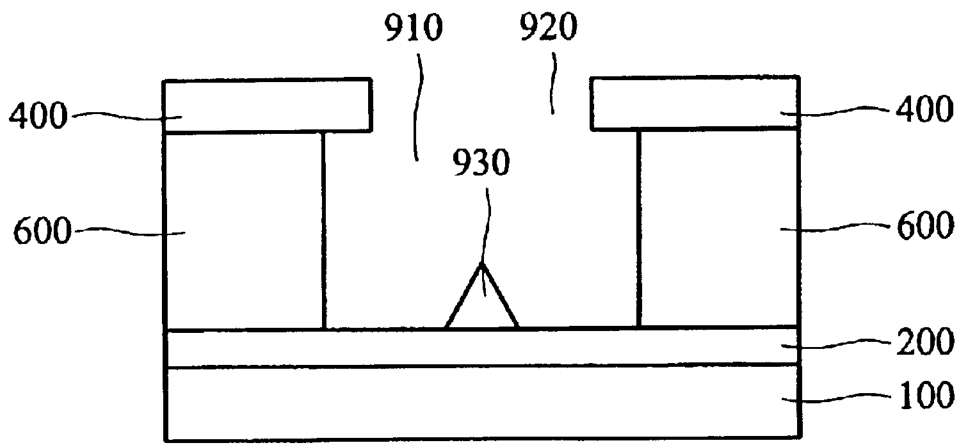
Figure 5G:
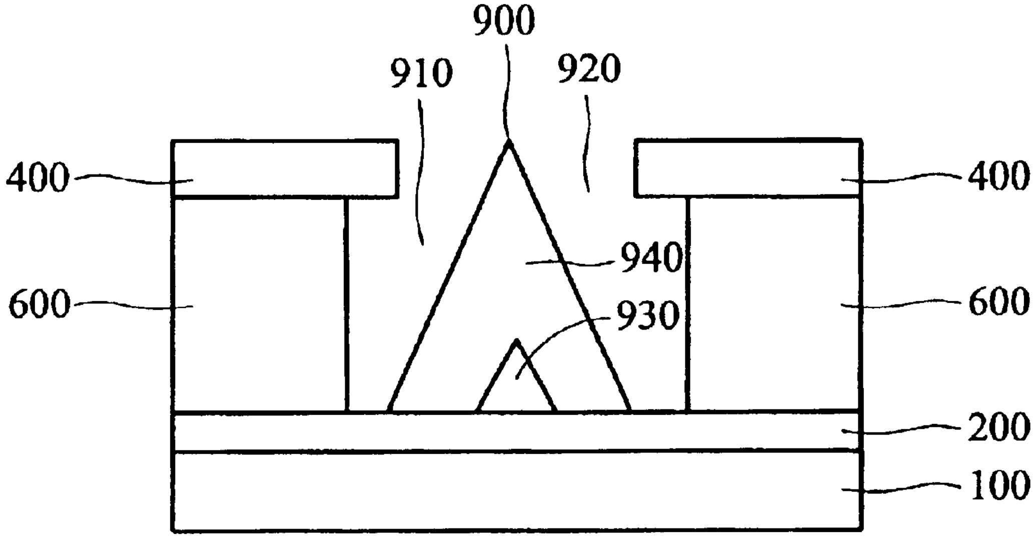

After the photoresist layer 700 is removed, as shown in FIG. 5E, the second insulating layer 650 is wet etched and removed. Moreover, because of the annular groove 520, the conductive layer 400 and the first insulating layer 600 are also etched to enlarge the annular groove 520 and remove the tip portion of the conductive layer so that a tip cavity 910, an opening 920 and an insulating tip 930 on the dielectric layer 200 are formed. The etching applied here is isotropic wet etching, as shown in FIG. 5F.

Finally, a molybdenum metal layer 940 is formed on the insulating tip 930 by conventional sputtering or electron beam. Thereby, an emitter tip 900 for use in the field emission display is completed.

The present invention provides a method of forming emitter tips for use in a field emission display with reduced molybdenum consumption. The present invention, having insulating tip with Spindt-type shape, can be used with conventional sputtering to form any kind of desirable electron-emitting materials to obtain an ideal emitter tip. It can be applied to the process for larger-size field emission display as well.

Additionally, any other thin films that have electron-emitting property can replace the molybdenum used in present invention. The thin films are, for example, DLC (diamond like carbon) or Nanotube.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of forming emitter tips for use in a field emission display comprising the steps of:

depositing a dielectric layer, an insulating layer, and a conductive layer on a substrate sequentially;

forming an annular groove in the conductive layer and the insulating layer;

etching the annular groove to form a tip cavity and an insulating tip therein on the dielectric layer; and forming a metal layer on the insulating tip to form an emitter tip.

2. The method as claimed in claim 1, further comprising the steps of:

forming a photoresist layer with an annular opening on the conductive layer.

3. The method as claimed in claim 2, further comprising the steps of:

etching the conductive layer and the insulating layer through the annular opening in the photoresist layer to form the annular groove.

4. The method as claimed in claim 2, further comprising the steps of:

removing the photoresist layer when the annular groove is formed in the conductive layer and the insulating layer.

5. The method as claimed in claim 1, wherein the tip cavity and the insulating tip are formed by isotropic wet etching.

6. The method as claimed in claim 1, wherein the metal layer on the insulating tip is formed by sputtering.

7. The method as claimed in claim 1, wherein the metal layer is made of molybdenum.

8. A method of forming emitter tips for use in a field emission display, comprising the steps of:

depositing a dielectric layer, a first insulating layer, a conductive layer and a second insulating layer on a substrate in sequence;

forming a hole in the second insulating layer and the conductive layer until a tip portion of the conductive layer is formed therein;

etching the hole to form an annular groove in the first insulating layer;

etching the annular groove and removing the tip portion of the conductive layer to form a tip cavity and an insulating tip therein on the dielectric layer; and forming a metal layer on the insulating tip to form an emitter tip.

9. The method as claimed in claim 8, further comprising the steps of:

forming a photoresist layer with an opening on the second insulating layer.

10. The method as claimed in claim 9, further comprising the steps of:

etching the second insulating layer and the conductive layer through the opening in the photoresist layer.

11. The method as claimed in claim 9, further comprising the steps of:

removing the photoresist layer after the annular groove in the first insulating layer is formed.

12. The method as claimed in claim 8, wherein the tip cavity and the insulating tip are formed by isotropic wet etching.

13. The method as claimed in claim 8, further comprising the steps of:

removing the second insulating layer after the tip cavity and the insulating tip are formed.

14. The method as claimed in claim 8, wherein the metal layer on the insulating tip is formed by sputtering.

15. The method as claimed in claim 8, wherein the metal layer is made of molybdenum.

* * * * *